April 22, 1958 E. E. SUMNER 2,831,986

SEMICONDUCTOR TRIGGER CIRCUIT

Filed Sept. 7, 1955

INVENTOR
E. E. SUMNER
BY [signature]
ATTORNEY

United States Patent Office 2,831,986

Patented Apr. 22, 1958

2,831,986

SEMICONDUCTOR TRIGGER CIRCUIT

Eric E. Sumner, North Caldwell, N. J., assignor to Bell Telephone Laboratories, Incorporated, New York, N. Y., a corporation of New York Application September 7, 1955, Serial No. 532,919

6 Claims. (Cl. 307—88.5)

Figure 1:
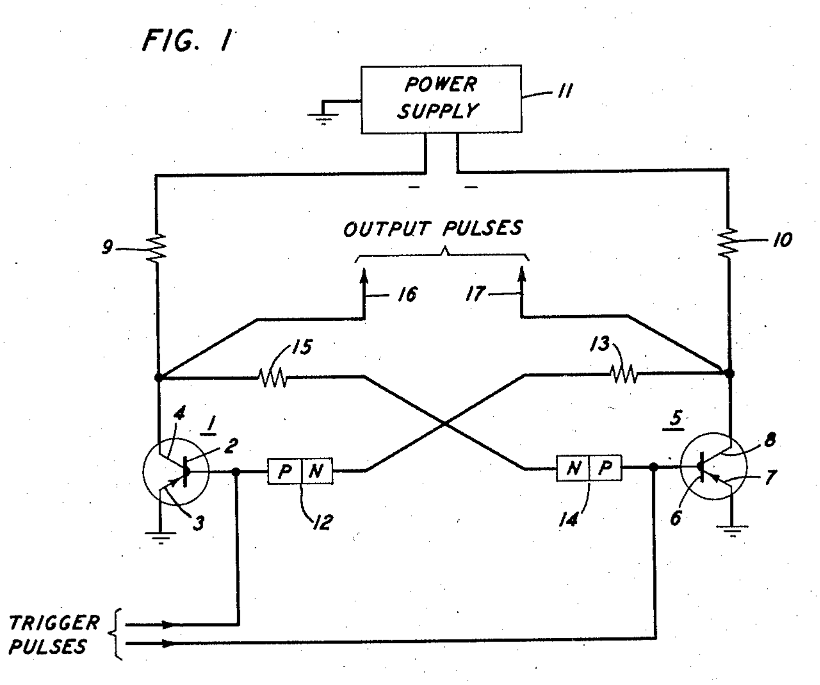

This invention relates to semiconductor signal translating devices and more particularly to bistable trigger circuits including semiconductor devices of the type known as transistors.

A circut of the type described below for the purpose of illustration has two stable states which are manifested by an output of two distinct voltage levels. Such circuits commonly are referred to as bistable multivibrators or flip-flop circuits and find application in switching networks, counting circuits, gates, and the like. A bistable multivibrator generally is a circuit which can be triggered alternately from one stable state of operation to the other by the application of triggering pulses. Some desirable considerations for a circuit of this type are that the circuit be stable, of relatively simple and compact construction, have rapid response to triggering impulses, require a minimum of operating power and produce output signals of sufficient amplitude to drive the load circuits connected thereto.

In furtherance of these desirable objectives, bistable multivibrator circuits have been constructed which utilize two semiconductor devices, each having a base electrode, an emitter electrode, and a collector electrode, such devices being known as transistors. Generally, the two transistors are cross-coupled to each other through resistance-capacitance networks and are each biased by a source of biasing potential so that when one device is in a state of high conduction the other is maintained in a state of zero or low conduction. The requirement of a separate source or sources of bias potentials may prove to be a burdensome one in many transistor multivibrator applications.

In one widely known type of transistor flip-flop circuit, for example, the separate source or sources of biasing potential provides the emitter electrode of the transistor, whose condition is changing from a conducting to a nonconducting state, with a back bias potential to aid the transistor during the turnoff interval and to cut it off more securely. Since the turning off transistor is heavily saturated during its "on" interval, its base electrode has an excess of minority carriers which must be swept out before the transistor can function properly in the flip-flop circuit. In a transistor of the PNP type, for example, the reverse bias provides a flow of reverse current into the base during the turnoff interval to speed up the removal of the excess carriers and, consequently, the switching time of the flip-flop.

In addition to the disadvantages associated with the requirement of separate sources of bias potential in such circuits, and in the use of restoration time constants which may preclude high speed operation, another difficulty which may arise in working with transistor flip-flop circuits is the inability of some types of these circuits to produce output signal potentials having amplitudes sufficiently high to insure continued reliable operation of the load circuits and devices connected to the flip-flop. Prior art attempts to overcome this problem frequently have provided such an increased output at the expense of switching speed.

It is, accordingly, a general object of this invention to provide an improved bistable multivibrator including two semiconductor devices.

Another object of this invention is to provide a high speed bistable multivibrator circuit which does not require any separate sources of bias voltage.

A further object of this invention is to provide a transistor bistable multivibrator circuit which makes use of the principle of base starvation. More specifically, it is an object of this invention to provide a transistor bistable multivibrator comprising means to enable the flow of reverse current into the base electrode during the turnoff interval of the transistor and to starve or shut off base current during the off period of the transistor.

A still further object of this invention is to provide an improved transistor multivibrator circuit which has a high current sensitivity to triggering pulses. More specifically, it is an object of this invention to provide an improved transistor multivibrator circuit having means in the coupling paths to minimize the diversion of trigger current from the transistor to be triggered.

A still further object of this invention is to provide an improved transistor bistable multivibrator having means in the coupling paths capable of increasing the amplitude of the output signal.

A still further object of this invention is to provide an improved transistor multivibrator circuit which utilizes relatively few components and thereby has the advantage of simplicity, low cost and low power drain.

These and other objects are realized in a specific illustrative embodiment of this invention which comprises a bistable multivibrator circuit including two transistors, two semiconductor diodes, and four resistors. Each transistor comprises an emitter, collector and base electrode and has its emitter electrode connected to ground. The base electrode of each transistor is direct-current coupled through a semiconductor diode, which advantageously may be of the silicon junction type, and a resistor to the collector electrode of the other transistor. The only source of potential needed is that connected through proper current limiting resistances to the collector electrode of each transistor, there being no separate source of potential for bias purposes required in devices constructed in accordance with the invention.

In the operation of the multivibrator circuit, the conducting state of each transistor alternates in response to applied triggering pulses. When one transistor is in a conducting condition, the other transistor is biased to cut-off due to the characteristics of the silicon junction diode connected therebetween, namely, that such diode will be in a substantially open or nonconducting state until a voltage of predetermined amplitude is applied thereacross. For voltages below this predetermined value, the biasing action of each silicon diode prevents current from flowing in the base circuit of a transistor connected thereto, and thereby maintains such transistor in a cutoff condition except for leakage currents.

The reverse dynamic characteristics of the silicon diodes in the coupling circuits is utilized to minimize storage time by enabling a maximum amount of reverse current to flow into a transistor of the flip-flop circuit during its turnoff interval. This enables the turning off transistor to come out of saturation much quicker than it would otherwise be able. When the transistor is in the off condition, however, the silicon diode connected thereto presents a high impedance to current flow in the reverse direction. This starvation effect of the silicon diode enables the transistor to be securely cut off without the need for separate bias potentials.

The static forward characteristic of a silicon diode is such that the diode presents a high impedance for all values of forward voltage applied thereacross up to a given value and then a low impedance for all forward voltages greater than this value. Thus, the silicon diode in each coupling path does not conduct until voltages of this given value are applied thereto. This given value is added to the normal voltage swing at the transistor collector electrode and serves to increase the amplitude of the output voltage signal produced by the switching action of the flip-flop.

In accordance with a feature of this invention, a pair of transistors in a bistable multivibrator circuit are direct-current coupled to each other through a pair of semi-conductor diodes.

It is another feature of this invention that no separate sources of direct-current bias potential are required for the transistors of the bistable multivibrator.

It is a further feature of this invention that the switching time of a bistable multivibrator is shortened by the utilization of semiconductor diodes in the base circuits of the transistors to enable a maximum amount of reverse current to flow into the base of a transistor during its turnoff interval.

It is a still further feature of this invention that the output signal from a direct-current coupled bistable multivibrator be increased by the addition of a pair of semiconductor diodes in the coupling circuits.

It is still another feature of this invention that both the reverse dynamic and reverse static characteristics of the coupling diodes be utilized to attain the advantageous operation of the transistor bistable circuit. Thus only during the transition or turnoff time, when the transistors are changing state, current will flow into the base of the transistor being turned off due to the dynamic reverse characteristic of the diode; however, once the transistor is turned off, no reverse current can flow due to the static reverse characteristic of the diodes. Further, in accordance with this feature of the invention, the reverse current only flows into the base of one of the transistors during the turnoff interval of that transistor, being then starved during subsequent and other intervals of operation of the circuit.

Figure 2:
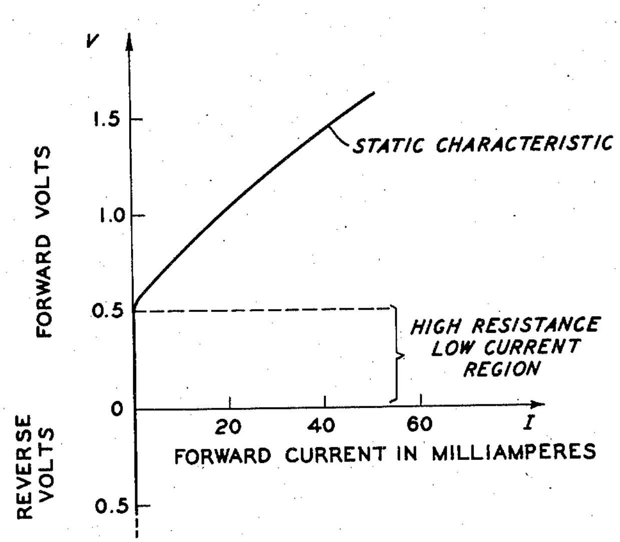

A complete understanding of this invention, together with the above-noted and other features thereof, may be gained from consideration of the following detailed description and accompanying drawing, in which:

Fig. 1 is a schematic representation of a bistable multivibrator illustrative of one specific embodiment of the invention; and Fig. 2 is a plot of the static forward characteristics of one type of semiconductor diode which advantageously may be utilized in the present invention.

Referring now to the drawing, the specific embodiment of a bistable multivibrator circuit illustrated in Fig. 1 comprises a transistor 1 including a base electrode 2, an emitter electrode 3, and a collector electrode 4, and a transistor 5 including a base electrode 6, an emitter electrode 7 and a collector electrode 8. In accordance with an aspect of this invention, transistors 1 and 5 advantageously may be transistors of the alloy junction type, such as are known in the art. The collector electrodes 4 and 8 of transistors 1 and 5 are connected through current limiting resistors 9 and 10, respectively, to a single source of operating potential 11. The emitter electrodes 3 and 7 of the transistors each are connected to ground. The base electrode of each transistor is coupled through a semiconductor diode and a resistor to the collector electrode of the other transistor. Specifically, base electrode 2 of transistor 1 is coupled through semiconductor diode 12 and resistor 13 to collector electrode 8 of transistor 5 and the base electrode 6 of transistor 5 is coupled through semiconductor diode 14 and resistor 15 to collector electrode 4 of transistor 1.

Advantageously, semiconductor diodes 12 and 14 each may comprise an integral body of semiconductive material, such as silicon, having two contiguous portions of opposite conductivity types (one of P-type material, the other of N-type material), with a thin transition layer of material at the interface in which there is a progressive change of transition from the degree and type of conductivity characteristic of one body portion to the degree and type of conductivity characteristic of the other body portion. A pair of electrodes providing connections to the two body portions complete each device. The electrical characteristics of the junction of each such diode depend markedly on the concentration gradient in the transition layer, that is, on the specific manner in which the conductivity varies from one body portion to the other. It is known that with a proper relationship between the concentration gradient and the transition layer and the lifetimes of the charge carriers, the device becomes a rectifier. In the forward direction of current flow through the junction, the resistance is high for potentials applied thereto up to a given amplitude and then becomes low, whereupon current increases at the usual exponential rate with each increase in applied potential across the electrodes. In the opposite or reverse direction under static conditions, resistance is initially high, and only a small current appears until a predetermined value of applied voltage is reached, at which point the current increases precipitously with further small increases in voltage. The characteristics of such semiconductor diodes are explained in greater detail in an article entitled "Transistors and Junction Diodes in Telephone Power Plants," by F. H. Chase et al., in the Bell System Technical Journal for July 1954 (vol. XXXIII, No. 4), at page 827 et seq., and in application Serial No. 211,212, filed February 16, 1951, of W. Shockley, now Patent 2,714,702, granted August 2, 1955. Such diodes have also been variously referred to as Zener, threshold, breakdown, and avalanche diodes due to the above-explained reverse characteristic wherein a state of high conduction in the reverse direction is attained only after the application of voltages having amplitudes equal to a predetermined breakdown or threshold value. Although this reverse breakdown effect has been found useful in many circuits as known in the art, this effect does not play a part in the present invention as the range of voltages employed herein advantageously falls below the reverse breakdown value and accordingly no reverse current flows in circuits according to this invention due to static applied voltages though, in accordance with one aspect of this invention, dynamic reverse current flows while a transistor is being turned off.

As further explained above, the static forward characteristics of this type of semiconductor diode are somewhat similar to the static reverse characteristics in that a finite voltage of given amplitude must be applied across the diode in the forward direction before current conduction takes place. However, due to the relatively low value of critical voltage required, this forward effect, although known in the prior art, has not been priorly utilized in the design and construction of bistable multivibrator circuits as circuits of this type generally have been operated with potentials far greater than this critical amplitude. In accordance with an aspect of this invention, semiconductor diodes 12 and 14 advantageously are connected in the forward direction. Fig. 2 of the drawing illustrates the static forward voltage current characteristic of a silicon diode which advantageously may be utilized in the invention. It will there be seen that for forward voltages up to approximately 0.5 volt the forward resistance of each diode is very high and little or no current will flow therethrough. Only when the applied forward voltage is higher than 0.5 volt does an appreciable amount of current begin to flow, which current increases in a substantially exponential manner thereafter. Thus, it is clear that for voltages of approximately 0.5 volt or less the silicon diode will be in a substantially open or nonconducting condition and, in effect, will act as a rectifier in series with a bias potential source of 0.5 volt. However, as pointed out above, when the transistor is not in one of its two stable states, but is changing from a conducting to a nonconducting condition, the silicon diode connected to its base electrode allows reverse currents to flow as part of the storage phenomenon associated with such diodes.

In the operation of the invention, assume that transistor 1 is in the conducting condition and that transistor 5 is in a nonconducting condition. If proper values of power supply voltage and limiting resistors are chosen, as for example, minus 10 volts and 1000 ohms, respectively, there will be approximately −0.2 volt on the collector electrode 4 of transistor 1. Since the silicon diode 14 connected to the collector electrode 4 of transistor 1 has only 0.2 volt applied thereacross in the forward direction, it will be below the critical value for conduction and thus will be substantially open. As a result, no base current will flow in transistor 5, and the transistor will be cut off except possibly for leakage currents.

With a voltage substantially greater than 0.5 volt thereacross, silicon diode 12 in the base circuit of transistor 1 will be conducting. A negative triggering pulse applied to the base 6 of transistor 5 will bring transistor 5 into conduction and will cut off the base current for transistor 1 by the process described above. Therefore, transistor 1 will be turned off. A change of state thus may be effected by applying negative pulses to the base of the transistor that is in the off or nonconducting condition.

It should be noted that in accordance with an aspect of this invention, the semiconductor diodes in the coupling circuit provide a minimum of diversion of trigger current from the off transistor, when such negative pulses are applied to the base electrode thereof. This occurs because the negative pulses tend to back-bias the silicon diode connected to the base electrode of the nonconducting transistor. The high back impedance of this diode thus permits the trigger current to flow only into the base of the off transistor. This method of triggering manifestly results in greatly increased current sensitivity of the flip-flop. It will be appreciated by those skilled in the art that a change of state also can be produced by placing positive triggering pulses on the base of the conducting transistor.

A further advantage of semiconductor diodes 12 and 14 is that they increase the amplitude of the output pulses which may be taken from output conductors 16 or 17. This is possible since the 0.5 volt necessary to cause each of the diodes to conduct is added to the output pulses produced by the transistors. Thus, an output pulse whose amplitude is determined by this sum is available on the output leads.

It further will be appreciated by those skilled in the art that when the conducting transistor changes its state to the nonconducting condition the silicon diode connected to its base electrode permits a maximum amount of base current to flow during the turnoff interval. This reverse current is allowed to flow as part of the storage phenomenon associated with such diodes and is thus a dynamic effect actively distinct from the static reverse characteristic of the diode. As heretofore explained, during the conduction time of a transistor of the flip-flop circuit, the transistor generally is strongly saturated. As the transistor must be free of the excess carriers which are in the base as a result of this saturation before it can function properly in the multivibrator circuit, a considerable delay in the switching time of the multivibrator may result. This delay is avoided by the provision of the semiconductor diodes in the coupling circuits between the two transistors. The reverse current which flows into the base of the transistor switching from a conducting to a nonconducting state helps to eliminate the excess carriers and thereby shorten the turnoff interval. This action of the semiconductor diodes considerably speeds up the recovery time of the transistor and permits the use of the invention in present day high speed switching networks.

In one embodiment of the invention in accordance with the circuit of Fig. 1, the various elements had the following typical circuit values:

| | | |
|---|---|---|
| Resistor **9** | ohms | 1,000 |
| Resistor **10** | do | 1,000 |
| Resistor **13** | do | 300 |
| Resistor **15** | do | 300 |
| Power supply **11** | volts | −10 |

It will be appreciated that the coupling resistors 13 and 15 in the illustrative circuit of Fig. 1 serve to increase the amplitude of the output pulses by increasing the voltage swing at the collector electrodes 4 and 8 of transistors 1 and 5, respectively. However, where greater speed of operation is desired, coupling resistances 13 and 15 may be omitted and the semiconductor diodes connected directly to the transistor collector electrodes.

It is to be understood that the above-described arrangements merely are illustrative of the application of the principles of the invention. Numerous other arrangements may be devised by those skilled in the art without departing from the spirit and scope of the invention.

What is claimed is:

1. A bistable multivibrator comprising a pair of transistor devices, each device including a base, an emitter and a collector electrode, means connecting the emitter electrode of each transistor device to ground, a source of potential, means connecting said source to the collector electrode of each transistor device, and means for providing a cutoff bias for one of said transistor devices when the other is in a conducting condition, said last-named means including a pair of semiconductor threshold diodes of the type having little or no conduction until a potential of a predetermined minimum amplitude is applied thereacross, each of said diodes coupling the base electrode of one transistor device to the collector electrode of the other.

2. A bistable multivibrator in accordance with claim 1 wherein said potential of predetermined amplitude is approximately 0.5 volt.

3. A bistable multivibrator in accordance with claim 1 wherein each semiconductor diode is comprised of silicon.

4. A bistable multivibrator comprising a pair of transistor devices, each device including a base, an emitter and a collector electrode, means connecting the emitter electrode of each transistor device to ground, a source of potential, means connecting said source to the collector electrode of each transistor, and a direct current cross-coupling path between the base of each transistor and the collector of the other transistor, said paths each including a semiconductor diode having a high resistance in the forward direction for low voltages, a low resistance in the forward direction for higher voltages, and a high resistance in the reverse direction for values of voltage applied thereto and said diode being connected so as to be in the forward direction for current flow from the base electrode of one of said transistor devices to the collector electrode of the other of said devices.

5. A bistable multivibrator comprising a pair of transistors of the same conductivity type, each transistor including a base, an emitter and a collector electrode, means connecting the emitter electrode of each transistor to ground, a source of potential, means connecting said source to the collector of each transistor and a direct-current cross-coupling path between the base of each transistor and the collector of the other transistor, said paths each including a threshold type semiconductor diode having a high resistance in the forward direction when relatively low voltages are connected thereacross, a low resistance in the forward direction when voltages above a preassigned threshold are connected thereacross, and a high resistance in the reverse direction for a large range of voltages connected thereacross, said threshold diodes connected so that the base electrode of each transistor and that portion of said threshold diode connected thereto are of opposite conductivity type semiconductor material.

6. A bistable multivibrator in accordance with claim 5 in combination with triggering means connected to the base electrode of each said transistors for applying triggering pulses thereto whereby in response to said pulses either transistor may be placed in a conducting or non-conducting condition.

References Cited in the file of this patent

UNITED STATES PATENTS

| | | |
|---|---|---|
| 2,569,345 | Shea | Sept. 25, 1951 |
| 2,655,609 | Shockley | Oct. 13, 1953 |
| 2,724,780 | Harris | Nov. 22, 1955 |

OTHER REFERENCES

Proc. I. R. E., vol. 43, pp. 826–834: July 1955, "Non-saturating Pulse Circuits Using Two Junction Transistors," by J. G. Linvill.